United States Patent
Harari et al.

(10) Patent No.: US 10,741,581 B2
(45) Date of Patent: Aug. 11, 2020

(54) FABRICATION METHOD FOR A 3-DIMENSIONAL NOR MEMORY ARRAY

(71) Applicant: Sunrise Memory Corporation, Los Gatos, CA (US)

(72) Inventors: Eli Harari, Saratoga, CA (US); Scott Brad Herner, Lafayette, CO (US); Wu-Yi Henry Chien, San Jose, CA (US)

(73) Assignee: SUNRISE MEMORY CORPORATION, Fremont, CA (US)

( * ) Notice: Subject to any disclaimer, the term of this patent is extended or adjusted under 35 U.S.C. 154(b) by 0 days.

(21) Appl. No.: 16/510,610

(22) Filed: Jul. 12, 2019

(65) Prior Publication Data

US 2020/0020718 A1 Jan. 16, 2020

Related U.S. Application Data

(60) Provisional application No. 62/697,085, filed on Jul. 12, 2018.

(51) Int. Cl.
*H01L 21/00* (2006.01)
*H01L 27/11582* (2017.01)
(Continued)

(52) U.S. Cl.
CPC .... *H01L 27/11582* (2013.01); *H01L 21/0273* (2013.01); *H01L 21/02164* (2013.01);
(Continued)

(58) Field of Classification Search
CPC ......... H01L 21/02579; H01L 21/31053; H01L 21/0273; H01L 21/02532; H01L 21/02595;
(Continued)

(56) References Cited

U.S. PATENT DOCUMENTS 8,383,482 B2 2/2013 Kim et al.
8,630,114 B2 1/2014 Lue
(Continued)

OTHER PUBLICATIONS

"PCT Search Report and Written Opinion, PCT/US2019/041678", dated Oct. 9, 2019.

*Primary Examiner* — Nikolay K Yushin
(74) *Attorney, Agent, or Firm* — Edward C. Kwok; VLP Law Group, LLP

(57) ABSTRACT

A process for manufacturing a 3-dimensional memory structure includes: (a) providing one or more active layers over a planar surface of a semiconductor substrate, each active layer comprising (i) first and second semiconductor layers of a first conductivity; (ii) a dielectric layer separating the first and second semiconductor layer; and (ii) one or more sacrificial layers, at least one of sacrificial layers being adjacent the first semiconductor layer; (b) etching the active layers to create a plurality of active stacks and a first set of trenches each separating and exposing sidewalls of adjacent active stacks; (c) filling the first set of trenches by a silicon oxide; (d) patterning and etching the silicon oxide to create silicon oxide columns each abutting adjacent active stacks and to expose portions of one or more sidewalls of the active stacks; (e) removing the sacrificial layers from exposed portions of the sidewalls by isotropic etching through the exposed portions of the sidewalls of the active stacks to create corresponding cavities in the active layers; (f) filling the cavities in the active stacks by a metallic or conductor material; (g) recessing the dielectric layer from the exposed sidewalls of the active stacks; and (h) filling recesses in the dielectric layer by a third semiconductor layer of a second conductivity opposite the first conductivity.

9 Claims, 20 Drawing Sheets

(51) Int. Cl.
*H01L 21/306* (2006.01)
*H01L 21/02* (2006.01)
*H01L 21/311* (2006.01)
*H01L 21/768* (2006.01)
*H01L 29/08* (2006.01)
*H01L 21/027* (2006.01)
*H01L 21/3105* (2006.01)
*H01L 27/00* (2006.01)

(52) U.S. Cl.
CPC .. *H01L 21/02532* (2013.01); *H01L 21/02579* (2013.01); *H01L 21/02595* (2013.01); *H01L 21/02636* (2013.01); *H01L 21/30604* (2013.01); *H01L 21/31053* (2013.01); *H01L 21/31111* (2013.01); *H01L 21/31144* (2013.01); *H01L 21/76802* (2013.01); *H01L 21/76877* (2013.01); *H01L 29/0847* (2013.01)

(58) Field of Classification Search
CPC ......... H01L 21/30604; H01L 27/11575; H01L 21/02636; H01L 21/76802; H01L 29/0847; H01L 21/31111; H01L 21/02164; H01L 27/11582; H01L 21/31144; H01L 21/76877; H01L 27/02579; H01L 27/14601; H01L 27/14603
See application file for complete search history.

(56) References Cited

U.S. PATENT DOCUMENTS

| | | | |
|---|---|---|---|
| 9,698,152 B2* | 7/2017 | Peri | H01L 21/28512 |
| 9,711,529 B2 | 7/2017 | Hu et al. | |
| 10,014,317 B2* | 7/2018 | Peng | H01L 27/11582 |
| 2016/0086970 A1* | 3/2016 | Peng | H01L 27/11565 257/324 |
| 2016/0141294 A1* | 5/2016 | Peri | H01L 21/28568 257/324 |
| 2017/0053906 A1* | 2/2017 | Or-Bach | H01L 27/11548 |
| 2017/0092371 A1* | 3/2017 | Harari | G11C 16/10 |
| 2017/0148517 A1* | 5/2017 | Harari | G11C 11/5635 |

\* cited by examiner

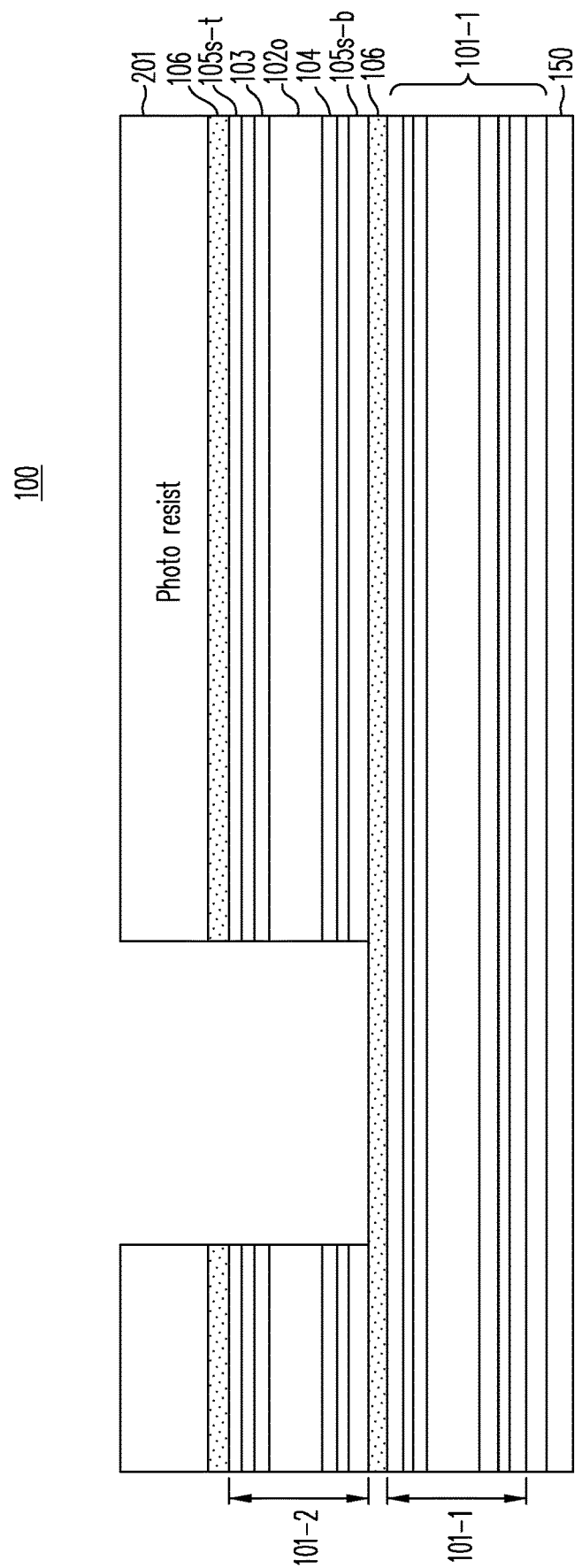
FIG. 2(iii)

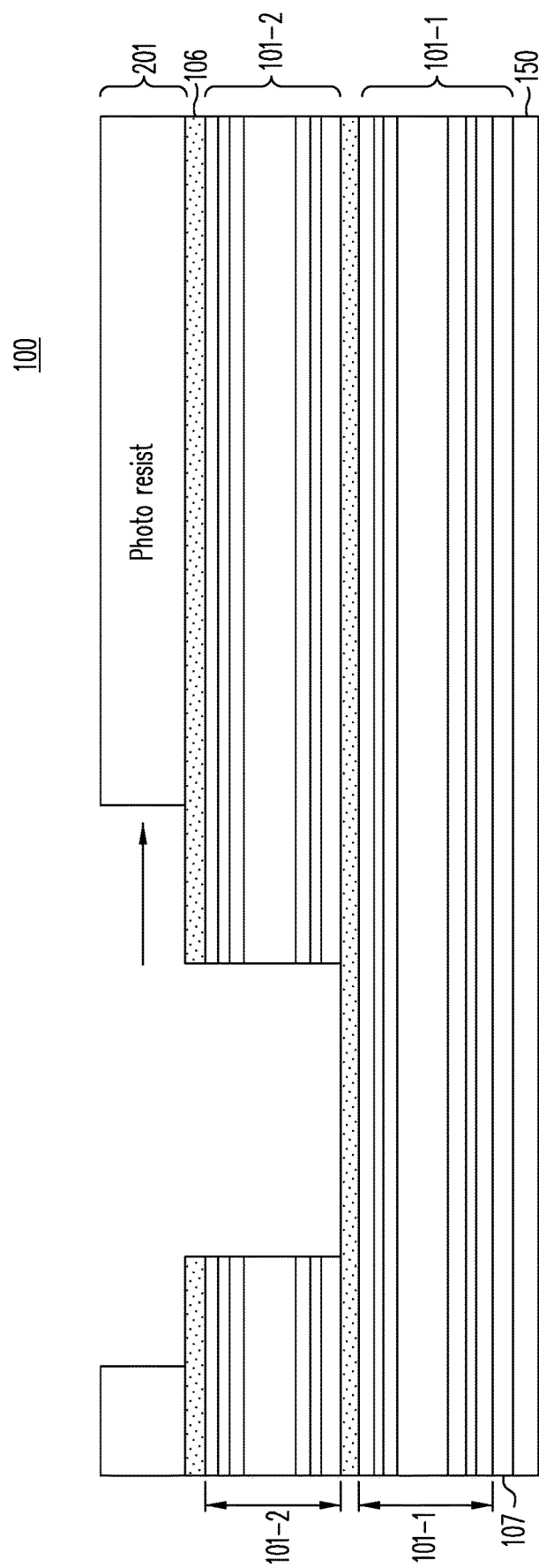
FIG. 2(iii)

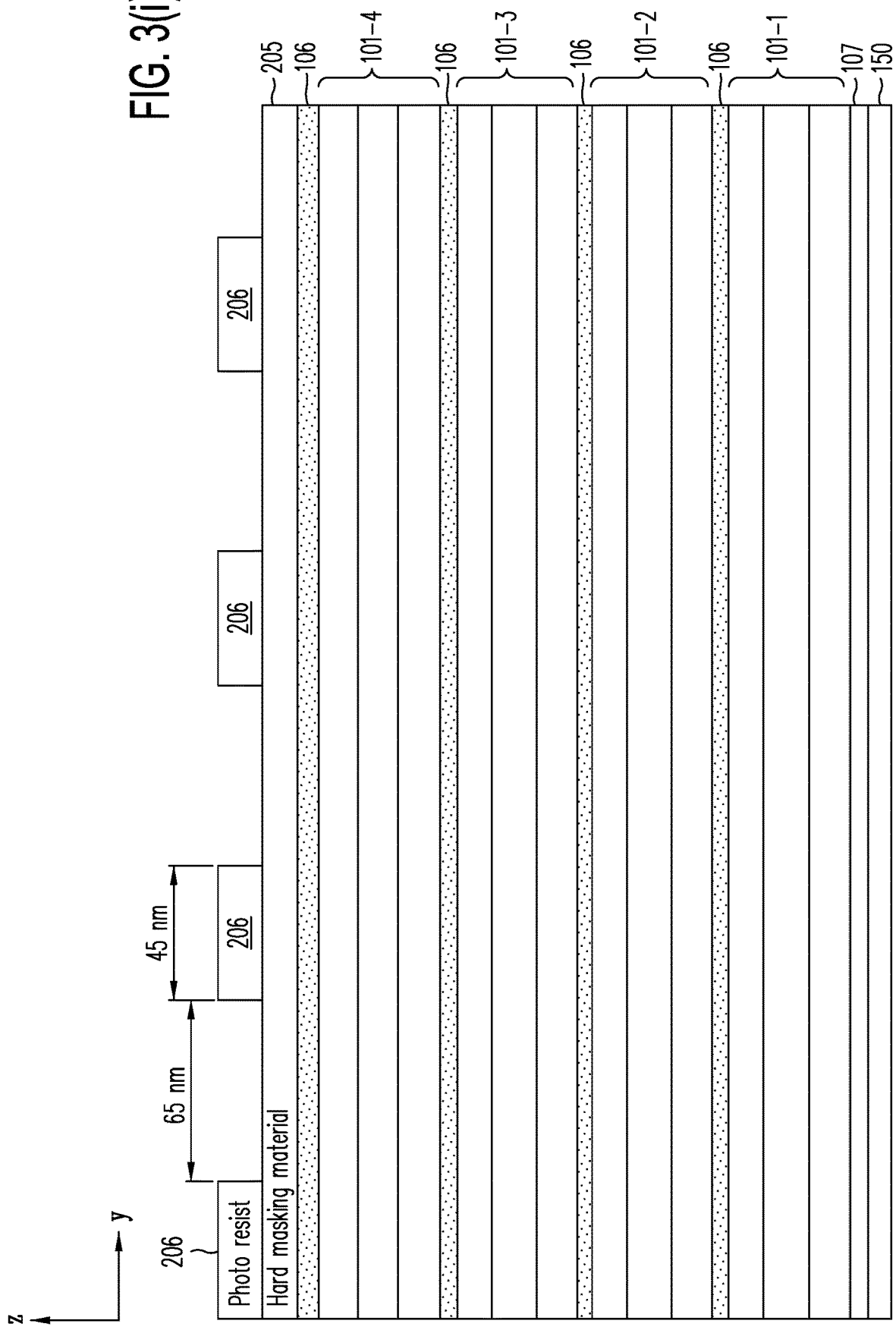

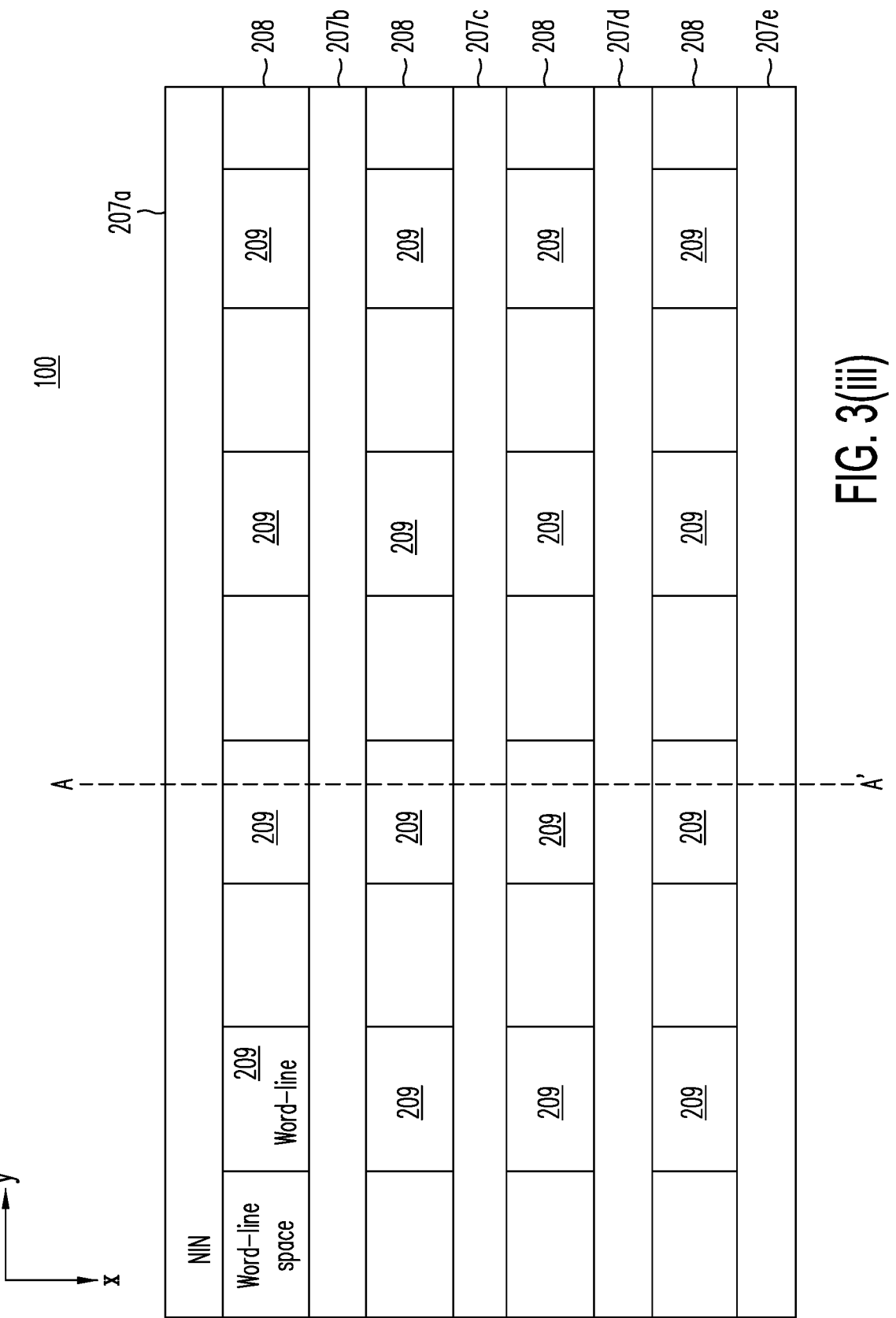
FIG. 3(iii)

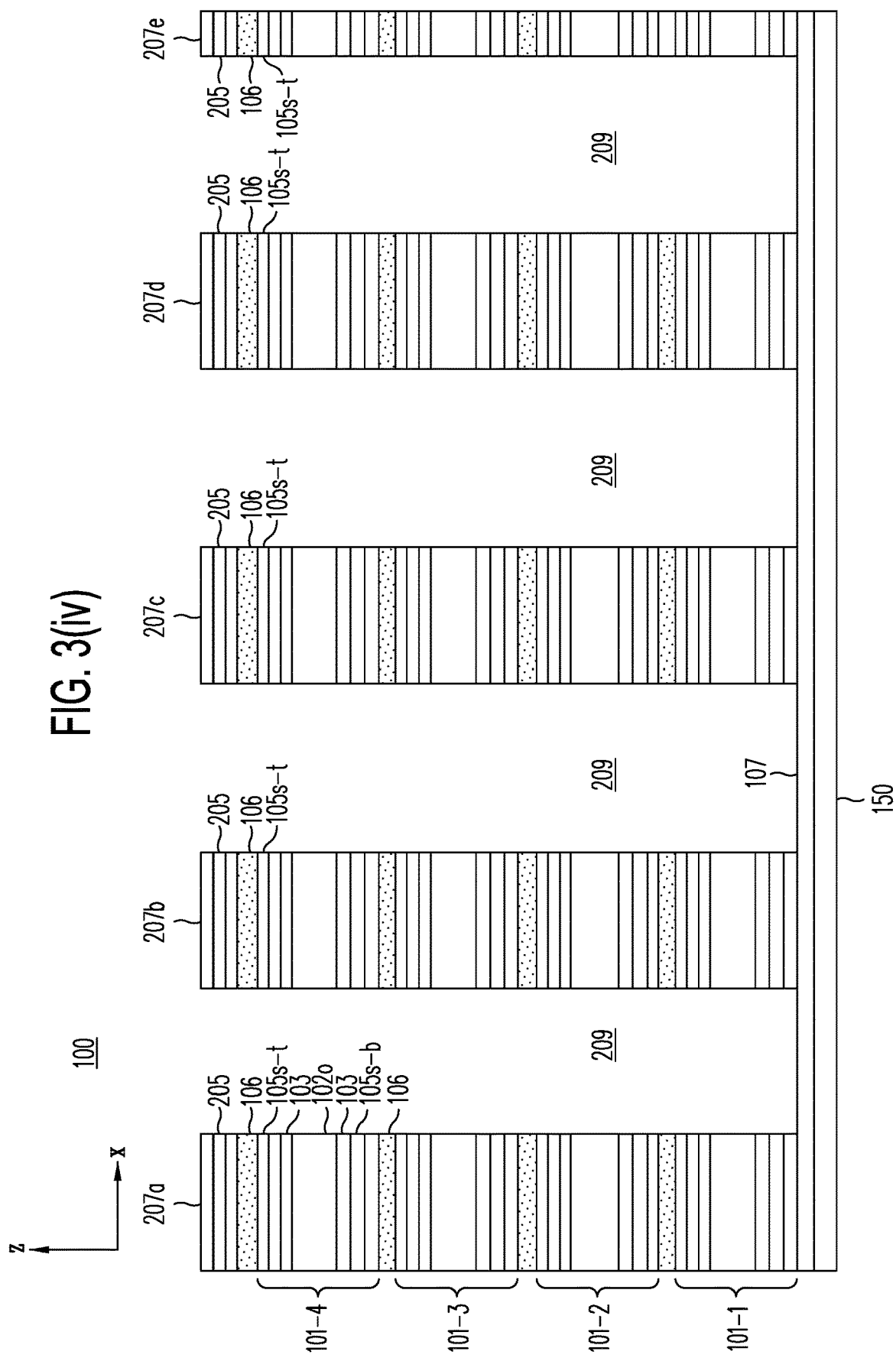

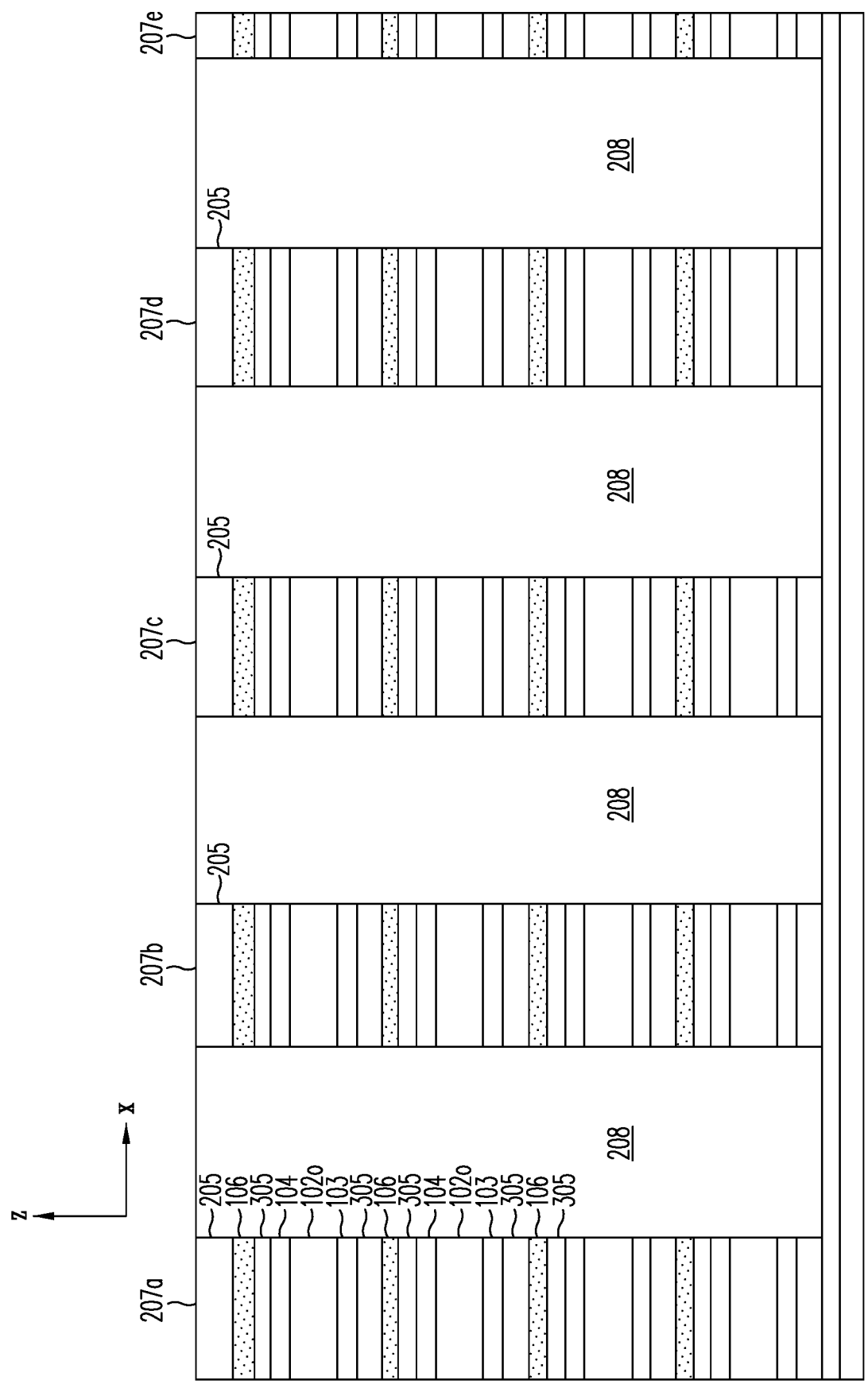
FIG. 3(vii)

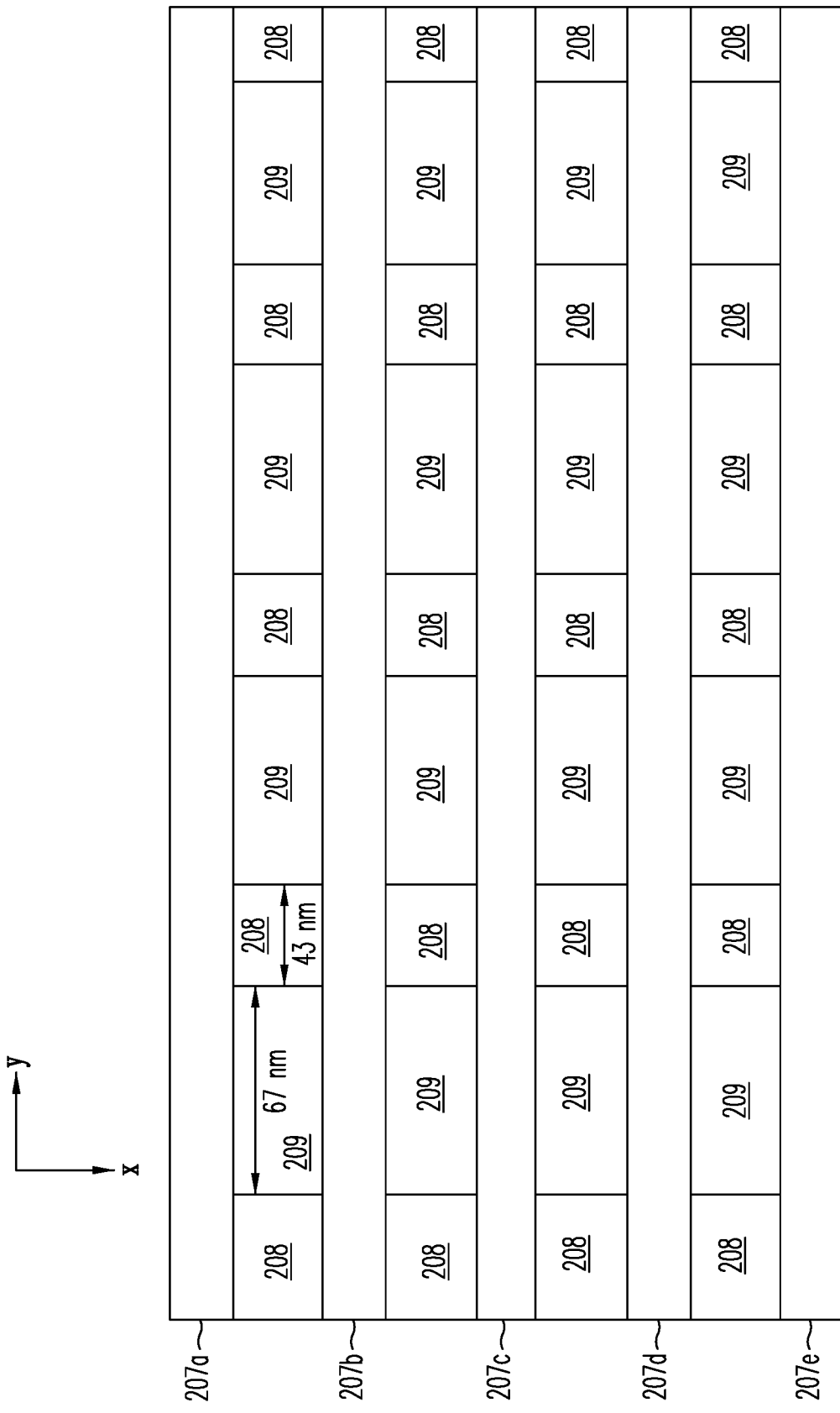
FIG. 3(viii)

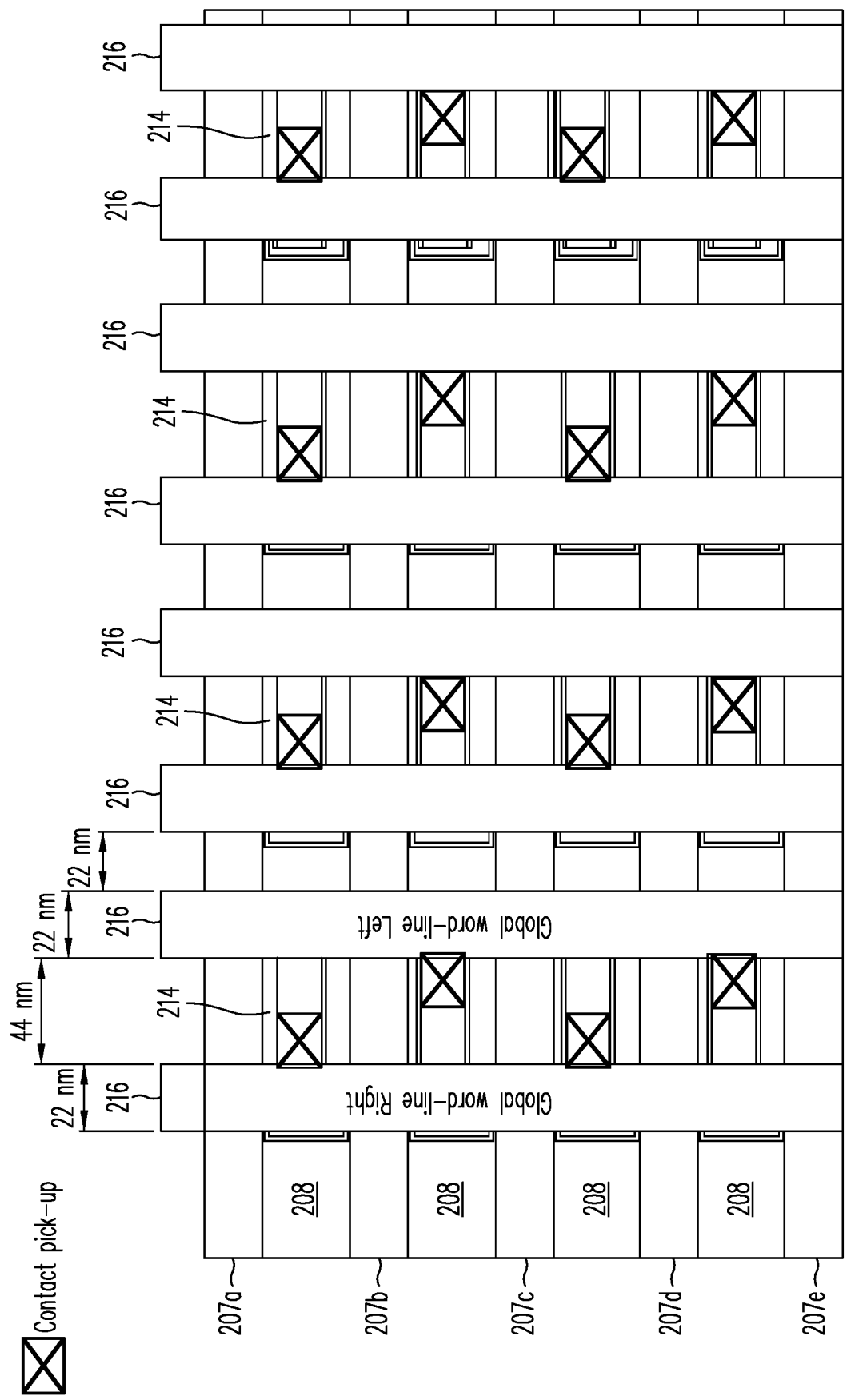
FIG. 3(xii)

FABRICATION METHOD FOR A 3-DIMENSIONAL NOR MEMORY ARRAY

CROSS REFERENCES TO RELATED APPLICATIONS

The present application is related to and claims priority of U.S. provisional patent application ("Provisional Application"), Ser. No. 62/697,085, entitled "Fabrication Method for a 3-Dimensional NOR Memory Array," filed on Jul. 12, 2018.

This application is also related to (i) copending U.S. patent application ("Copending Application I"), Ser. No. 15/248,420, entitled "Capacitive-Coupled Non-Volatile Thin-film Transistor Strings in Three-Dimensional Arrays," filed Aug. 26, 2016 and published as U.S. Patent Application Publication 2017/0092371A1; and (ii) U.S. patent application ("Copending Application II"), Ser. No. 16/012,731, entitled "3-Dimensional NOR Memory Array Architecture and Methods for Fabrication Thereof," filed on Jun. 19, 2018 and published as U.S. Patent Application Publication 2018/0366489A1. The disclosures of the Provisional Application and the Copending Applications I and II are hereby incorporated by reference in their entireties. References to the Copending Applications I and II herein are made by paragraph numbers of their respective publications.

BACKGROUND OF THE INVENTION

1. Field of the Invention

The present invention relates to non-volatile NOR-type memory strings. In particular, the present invention relates to fabrication processes for 3-dimensional arrays of non-volatile NOR-type memory strings.

2. Discussion of the Related Art

High-density structures representing arrays of generally non-volatile memory cells have been described in Copending Applications I and II. The memory arrays of Copending Applications I and II are organized as stacks of connected storage transistors ("active stacks") fabricated over a semiconductor substrate. Specifically, Copending Applications I and II disclose multiple strips of semiconductor layers ("active strips") in each active stack, with each strip providing storage transistors organized as NOR-type memory strings or "NOR memory strings". The semiconductor substrate on which the memory array is constructed include various types of support circuitry, such as power supply circuits, address decoders, sense amplifiers, input and output circuits, comparators, and control and other logic circuits.

FIG. 1a illustrates schematically memory structure 100 containing NOR memory strings that can be fabricated using methods of the present invention. In this context, a NOR memory string consists of individually and independently addressable storage transistors sharing a common source region and a common drain region. As described in Copending Applications I and II, each memory string may be formed along one side of an active strip, which includes multiple layers of semiconductor and conductor materials. Memory structure 100 is organized as m active stacks each containing n active strips, where m and n can be any integer. For example, m may be 1, 2, 4, 8, 16, 32, 64, . . . , 8192 or greater. Similarly, n may be 1, 2, 4, 8, . . . , 64 or greater.

As shown in FIG. 1a, memory structure 100 is represented by active stacks 130-$(p-1)$, 130-$p$, 130-$(p+1)$. In each active stack, n active strips, labeled 101-1, 102-1, . . . , 101-$n$, are separated and electrically isolated from each other by isolation layers 106. Isolation layer 106 may be, for example, a silicon nitride. Each active stack is covered on the outside by a layer charge storage material 121, which may be provided, for example, by an oxide-nitride-oxide ("ONO") triple-layer, as is known to those of ordinary skill in the art. Numerous conductive columns (not shown), separated from the active strips by charge storage material 121, are provided in the space between active stacks. These conductive columns provide gate electrodes, which are used to select and operate the storage transistors formed along the active strips on either side of the adjacent active stacks during read, write and erase operations. In the detailed description below, to simplify the detailed description and for reference convenience, the direction substantially perpendicular to the surface of the semiconductor substrate ("vertical") is labeled z. the direction along the length of each active strip is labeled y, and the direction along the width of each active strip is labeled x. The x and y directions are also referred to as "horizontal". One or more interconnect layers ("global interconnect layers") may be formed above or below memory structure 100 to provide conductors to interconnect the terminals of the storage transistors in NOR memory strings of memory structure 100 to circuitry in the semiconductor substrate.

Typically, one or more portions 108 in each active stack are dedicated for forming "staircase" or "reverse staircase" structures, which allow one or more of the semiconductor or conductor material layers in each active strip (e.g., the semiconductor layers providing a common drain region or "bit line" in the active strip) to be accessed electrically from the global interconnect layers, through conductors in vias (and buried contacts). In FIG. 1a, portions 108 ("staircase portions") are provided in the front and at the back of each active stack. Storage transistors are formed in the portion or portions of the active strips ("array portion" or "array portions") in each active stack outside of the staircase portion or portions. In FIG. 1a, array portion 109 is provided between staircase portions 108.

FIG. 1b illustrates schematically the semiconductor and conductor layers of active strip 101. As shown in FIG. 1b, active strip 101 includes (i) $n^+$ semiconductor layers 103 and 104 (e.g., n-type polysilicon) which may provide a common source region (or "source line") and a common drain region (or "bit line") for a NOR memory string; and (ii) intrinsic or lightly doped p-type ($p^-$) semiconductor layer 102, which may provide channel regions for the storage transistors of the NOR memory string. Between the dashed lines and separated from each active strip by charge storage material layer 121 would be provided conductors (not shown) that serve as gate electrodes for the storage transistors of the NOR string. The dashed lines in FIG. 1b indicate the positions of conductors 122-$(k-1)$, 122-$k$, and 122-$(k+1)$ which are representative of such conductors. In addition, as shown in FIG. 1b, conductor layers 105 (e.g., tungsten with adhesion and barrier films) are provided adjacent $n^+$ semiconductor layers 103 and 104. Conductor layers 105 reduce resistance in the common source and drain regions of the NOR memory string. Isolation layers 106 (e.g., silicon nitride) electrically isolate each active strip in the active stack from another.

The present invention provides a desired efficient process for fabricating memory structure 100.

SUMMARY

According to one embodiment of the present invention, a process for manufacturing a 3-dimensional memory structure includes: (a) providing one or more active layers over a planar surface of a semiconductor substrate, each active layer comprising (i) first and second semiconductor layers of a first conductivity; (ii) a dielectric layer separating the first and second semiconductor layer; and (ii) one or more sacrificial layers, at least one of sacrificial layers being adjacent the first semiconductor layer; (b) etching the active layers to create a plurality of active stacks and a first set of trenches each separating and exposing sidewalls of adjacent active stacks; (c) filling the first set of trenches by a silicon oxide; (d) patterning and etching the silicon oxide to create silicon oxide columns each abutting adjacent active stacks and to expose portions of one or more sidewalls of the active stacks; (e) removing the sacrificial layers from exposed portions of the sidewalls by isotropic etching through the exposed portions of the sidewalls of the active stacks to create corresponding cavities in the active layers; (f) filling the cavities in the active stacks by a metallic or conductor material; (g) recessing the dielectric layer from the exposed sidewalls of the active stacks; and (h) filling recesses in the dielectric layer by a third semiconductor layer of a second conductivity opposite the first conductivity. In addition, an isolation layer is provided to separate adjacent active layers.

According to one embodiment, the process further includes recessing the metallic or conductor layer from the exposed sidewalls of the active step, wherein filling recesses in the dielectric layer also fills recesses in the metallic or conductor layer.

According to one embodiment, the process further includes: (a) removing the silicon oxide columns prior to recessing the dielectric layer and (b) re-creating the silicon oxide columns after filling the recesses in the dielectric layer by the second semiconductor layer.

In one embodiment, the process further includes providing a charge material over the exposed sidewalls of the active stack and forming word lines by filling spaces surrounded by adjacent silicon oxide columns and adjacent active stacks with a conductor material. The third semiconductor layer includes an in situ boron-doped polysilicon. In that embodiment, (i) the first and second semiconductor layers of each active layer respectively form a common drain region and a common drain region of a plurality of storage transistors organized as a NOR memory string; (ii) the third semiconductor layer forms channel regions of the storage transistors in the NOR memory string; and (iii) the word lines form gate electrodes of the storage transistors in the NOR memory string.

According to one embodiment of the present invention, a staircase structure for accessing one or more semiconductor layers in a 3-dimensional memory structure includes: (i) providing a first active layer; (ii) providing a first isolation layer on top of the first active layer; (iii) providing a second active layer on top of the first isolation layer, wherein the first and second active layers each comprise (a) a first semiconductor layer of a first conductivity; (b) a dielectric layer of an insulative material underneath the first semiconductor layer; and (c) a second semiconductor layer underneath the dielectric layer; (iv) providing a second isolation layer on top of the second active layer; (iv) providing and patterning a photoresist layer over the second isolation layer to create an opening in the photoresist layer, thereby exposing a first area of the second isolation layer; (v) anisotropically removing the exposed first area of the second isolation layer and the portion of the second active layer under the first area of the second isolation layer so as to expose a first area of the first isolation layer; (vi) recessing the photoresist layer to increase the opening in the photoresist layer, such that a second area of the second isolation layer is exposed; (vii) anisotropically removing (a) the exposed first area of the first isolation layer and the exposed second area of the second isolation area, and (ii) the portions of the first semiconductor layer underneath the exposed first area of the first isolation layer and the exposed second area of the second isolation area; (viii) filling cavities created by the anisotropically removing steps of (v) and (vii), using the insulative material; (ix) repeating steps (i) through (viii) a predetermined number of times; and (x) anisotropically removing the insulative material at predetermined locations to create via openings to reach the first semiconductor layer of two or more active layers.

The present invention is better understood upon consideration of the detailed description below, in conjunction with the accompanying drawings.

BRIEF DESCRIPTION OF THE DRAWINGS

FIG. 1b illustrates schematically the semiconductor and conductor layers of an active strip 101 in memory structure 100 of FIG. 1a.

FIG. 3(i) is an x-z plane cross sectional view of array portion 109 of memory structure 100, showing patterned photoresist layer 205 defining a 45-nm width for each active stack and 65-nm width for each trench between adjacent active stacks.

FIGS. 3(iii) and 3(iv) are top and x-z plane cross-sectional views, respectively, showing resulting memory structure 100 after etching trenches 209 for the word lines to be formed.

FIGS. 3(vi) and 3(vii) are top and x-z plane cross-sectional views, respectively, showing resulting memory structure 100 after trenches 209 and cavities 211 are filled using a metallic/conductor material.

FIGS. 3(viii) and 3(ix) are top and x-z plane cross-sectional views, respectively, showing resulting memory structure 100 after both metallic/conductor layers 105 and spline oxide 102o are recessed.

FIG. 3(xi) is a x-z plane cross sectional view of memory structure 100 after charge storage material 213 and word lines 214 are deposited and planarized FIG. 3(xii) is a top view illustrating array portion 108 of memory structure 100, after formation of a global interconnect layer.

DETAILED DESCRIPTION OF THE PREFERRED EMBODIMENTS

Figure 1A:
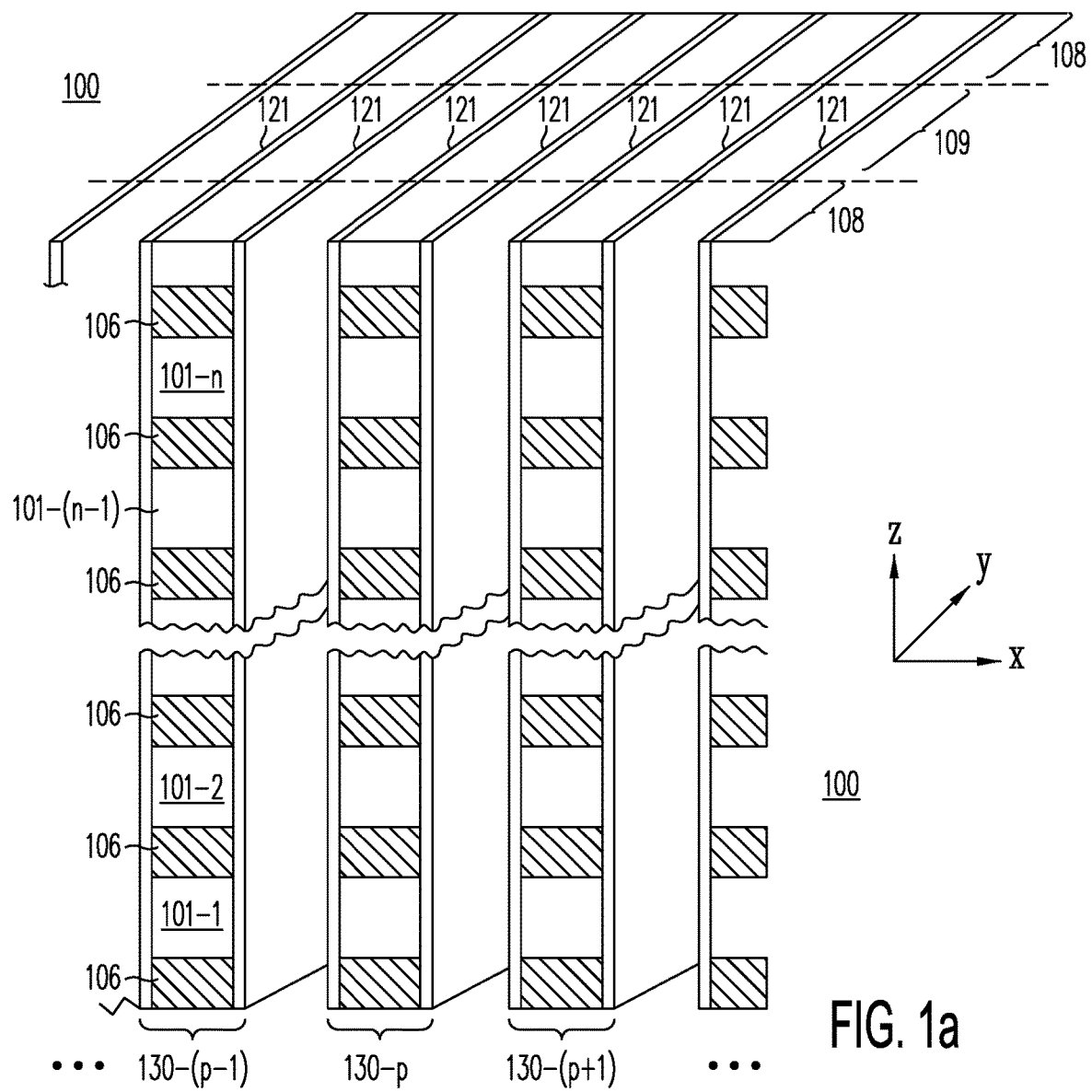
FIG. 1a illustrates schematically memory structure 100 containing NOR memory strings of the type that can be fabricated using methods of the present invention.
Figure 1B:
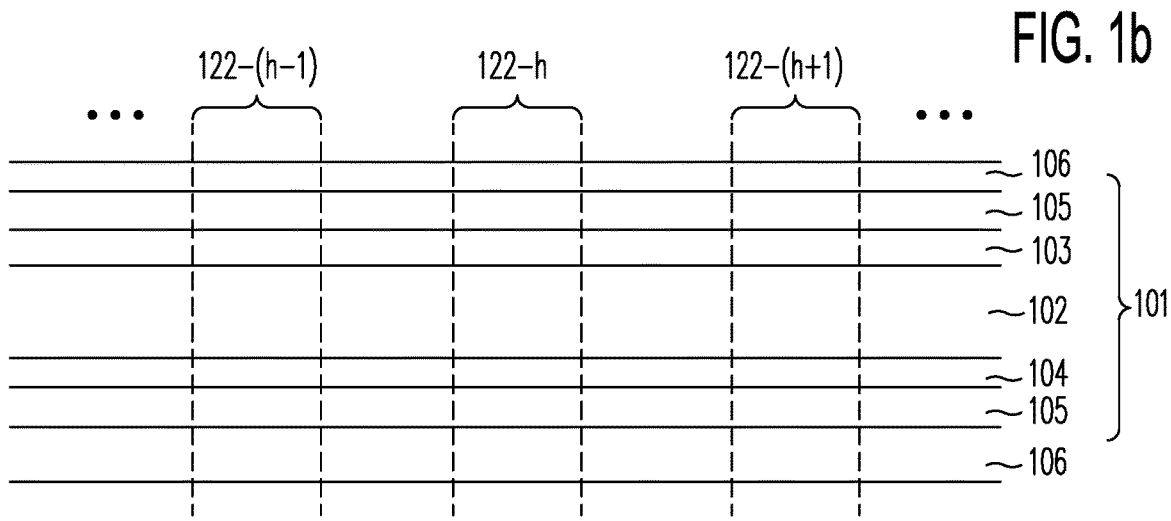

In this detailed description, like elements in the figures are provided like reference numerals to facilitate reference to features in the figures.

The present invention provides efficient processes for fabricating a memory structure containing an array of NOR memory strings. In the detailed description below, the parameters of each step (e.g., temperatures, pressures, precursors, compositions and dimensions) are provided for exemplary purposes only. Upon consideration of this detailed description, one of ordinary skill in the art will be able to modify or vary these parameters without departing from the scope of the present invention.

According to one embodiment of the present invention, a process is provided by which a memory structure containing NOR memory strings may be formed over a planar surface of a semiconductor substrate. Initially, various types of support circuitry may be formed in—or at the surface of—the semiconductor substrate (e.g., power supply circuits, address decoders, sense amplifiers, input and output circuits, comparators, and control and other logic circuits are fabricated).

An isolation layer (e.g., silicon oxide) may be formed on the planar surface. Buried contacts may be formed in the isolation layer for connection to the circuitry underneath. One or more global interconnect layers may then be formed above the isolation layer. (In the following detailed description, these layers are collectively referred to as substrate 150.)

Thereafter, base oxide film 107 (e.g., 50-nm silicon oxide film) is provided. The semiconductor and conductor layers of an active strip (collectively, an "active layer") are then provided. Multiple active layers may be provided, layer by layer, with each active layer being isolated from the next active layer by isolation films 106 (e.g., a 30-nm nitride layer). In one embodiment, in order of deposition, each active layer may include (a) sacrificial layer 105*s-b* ("SAC4 layer 105*s-b*"; e.g., a 40-nm layer of silicon germanium); (b) n$^+$ doped polysilicon layer 104 ("drain polysilicon 104"; e.g., 30-nm in situ arsenic-doped polysilicon film); (c) silicon oxide layer 102*o* ("spline oxide 102*o*"; 80-nm silicon oxide film); (d) n$^+$ polysilicon layer 103 ("source polysilicon 103"; e.g., 30-nm in situ arsenic-doped polysilicon film); and (e) sacrificial layer 105*s-t* ("SAC4 layer 105*s-t*"; e.g., a 40-nm layer of silicon germanium). SAC4 layers 105*s-b* and 105*s-t* are sacrificial layers that would each subsequently be replaced by a metallic conductor layer, as discussed below.

Figure 2I:
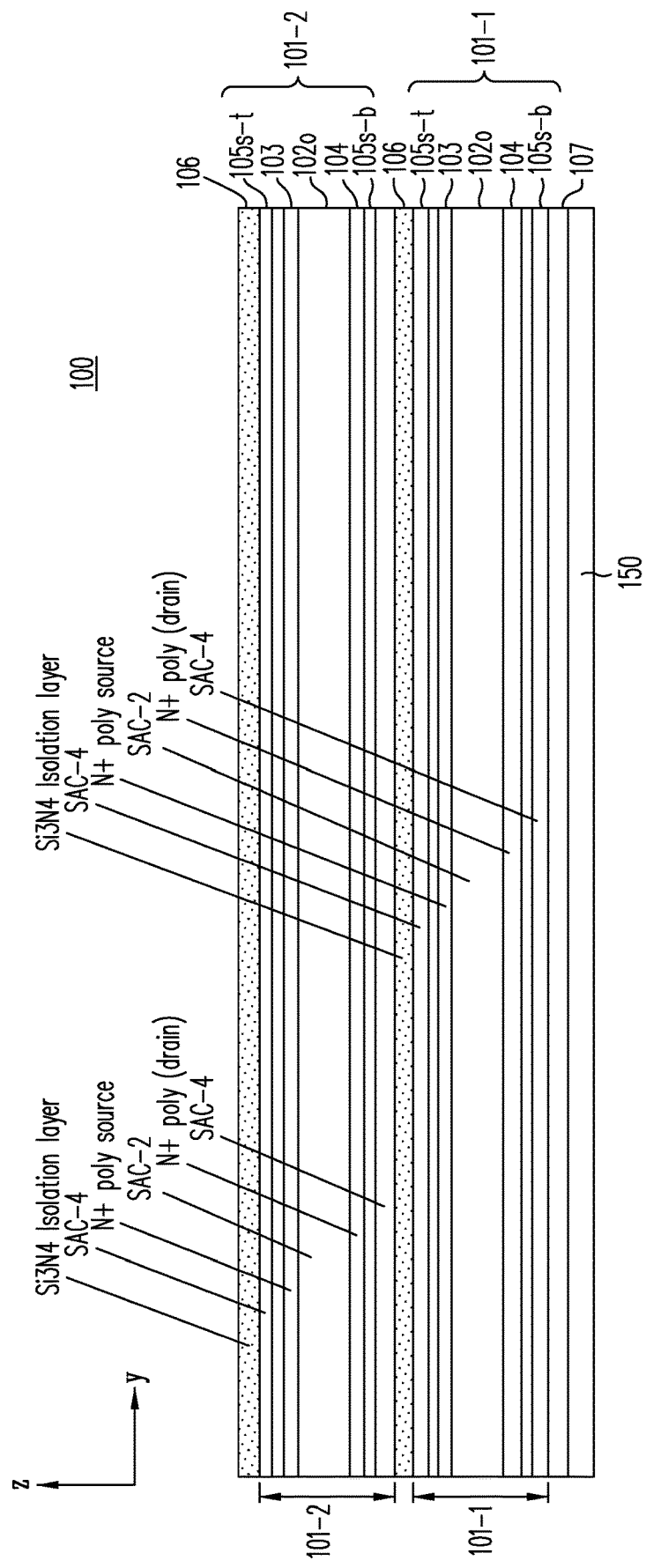
FIGS. 2(i), 2(ii), 2(iii), 2(iv), 2(v) and 2(vi) illustrate staircase portions 108 of memory structure 100, in accordance with one embodiment of the present invention.
Figure 2:
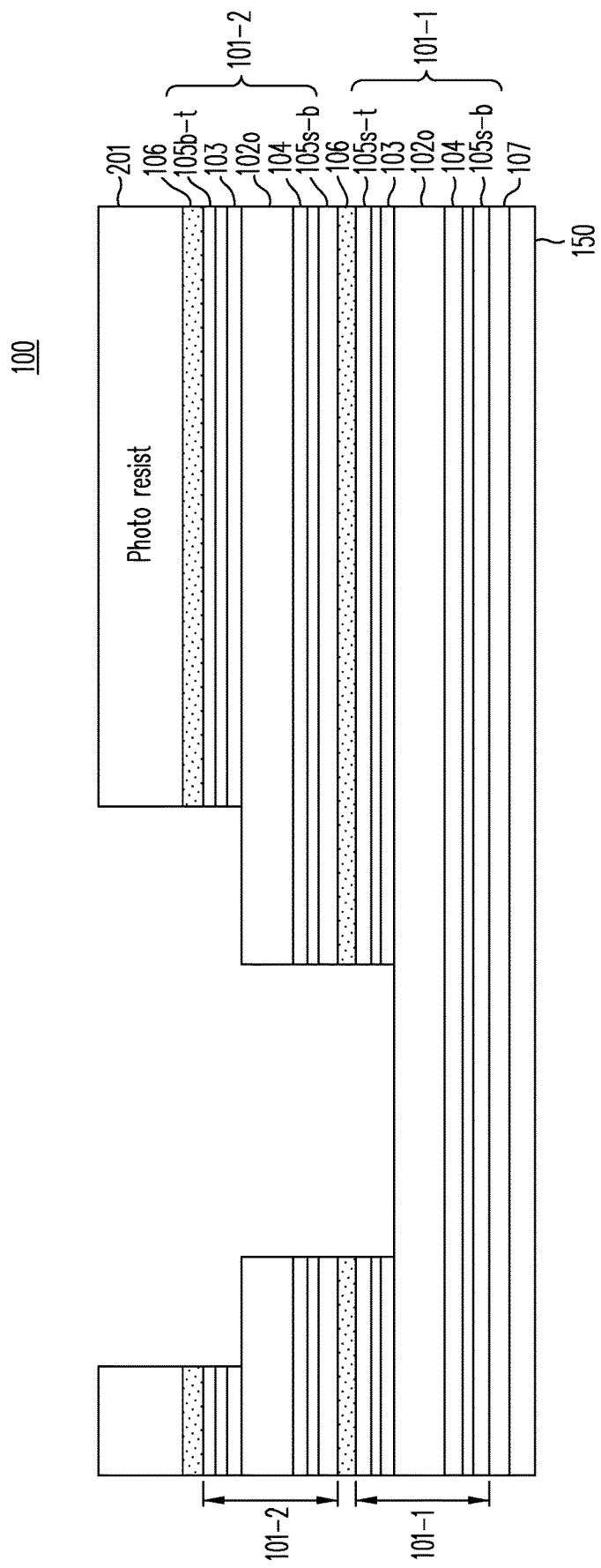
Figure 2V:
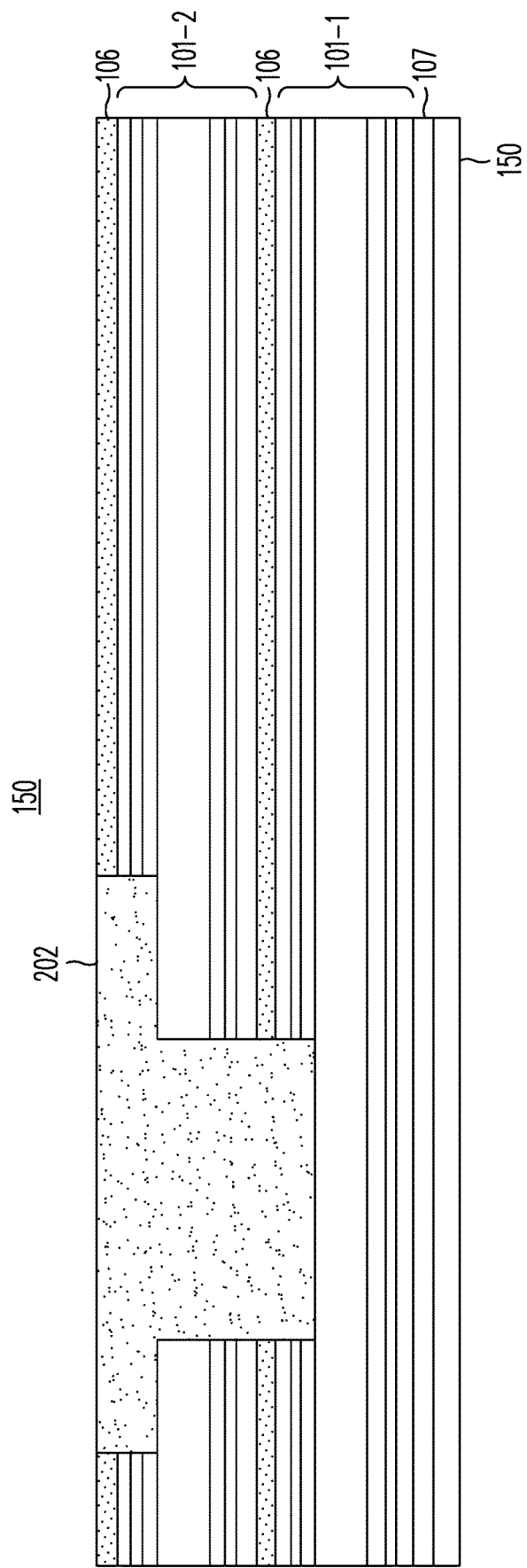
Figure 2:
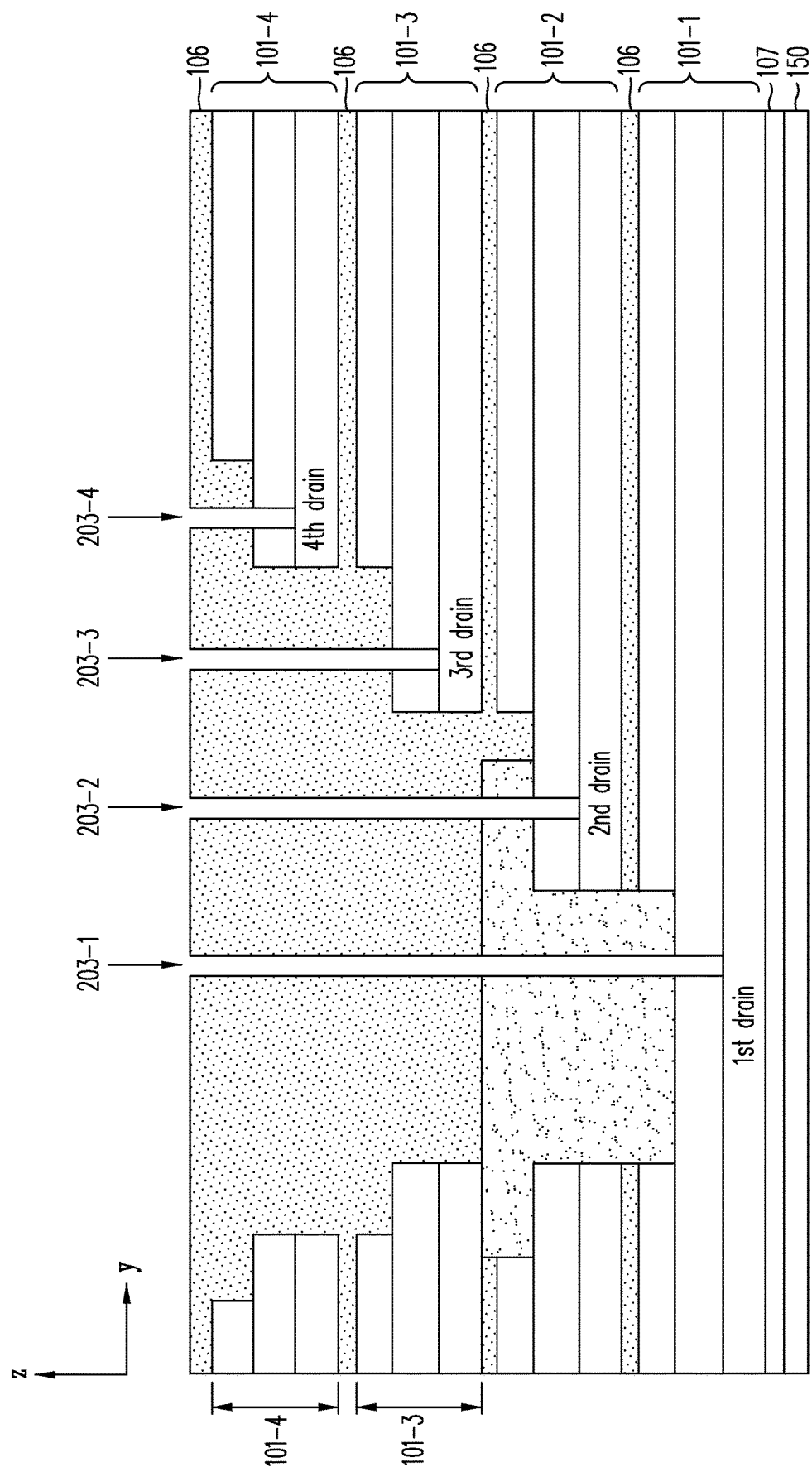

During depositions of the active layers, staircase structures for electrically accessing drain polysilicon 104 of each active strip to be formed are formed in staircase portions 108. Array portion 109 is protected from the staircase formation steps by a mask over array portion 109. According to the present invention, the staircase structures may be formed using one photolithography step for every two active layers. FIGS. 2(*i*) to 2(*vi*) illustrate staircase structure formation in staircase portions 108 of memory structure 100, in accordance with one embodiment of the present invention.

FIG. 2(*i*) shows memory structure 100 after depositions of active layers 101-1 and 101-2. Thereafter, photoresist layer 201 is deposited and patterned over memory structure 100. A first etching step removes from the area not protected by photoresist 201, film by film, (a) isolation layer 106 and (b) active layer 101-2 (i.e., "SAC4 layer 105*s-tb*; source polysilicon 103, spline oxide 102*o*, drain polysilicon 104, and SAC4 layer 105*s-b* of active layer 101-2). This first etching step stops at isolation 106 immediately above active layer 101-1. The resulting structure is shown in FIG. 2(*ii*).

Photoresist layer 201 is then recessed to further expose addition areas of active layer 101-2. The resulting structure is shown in FIG. 2(*iii*). Thereafter, a second etching step removes from the exposed portions of isolation films 106 immediately above active layers 101-1 and 101-2, (a) SAC4 layers 105*s-t* of both active layers 101-1 and 101-2, and (b) source polysilicon 103 of both active layers 101-1 and 101-2. This second etching step stops at spline oxide layers 102*o* of both active layers 101-1 and 101-2. The resulting structure, which is a two-step staircase structure, is shown in FIG. 2(*iv*). Photoresist layer 201 is then removed.

Silicon oxide 202 is then provided to fill the cavities created by the first and second etching steps. A following planarization step (e.g., chemical-mechanical polishing (CMP)) planarizes the resulting surface. The resulting structure is shown in FIG. 2(*v*). Vias can then be created in silicon oxide 202 and the underlying spline oxide 102*o* of each of active layers 101-1 and 101-2 to allow access to drain polysilicon 104 of each of active layers 101-1 and 101-2. These vias are created in a subsequent oxide etch after all active layers are deposited, as discussed below.

The steps discussed in conjunction with FIGS. 2(*i*) to 2(*v*) are repeated every two active layers deposited. Note that, these staircase formation steps discussed in conjunction with FIGS. 2(*i*) to 2(*v*) require one photolithography step every two active layers deposited, which is more advantageous than staircase formation steps used previously, which require a photolithography step for every active layer deposited.

After all active layers of memory structure 100 are deposited and the cavities from the last first and second etching steps on the final two active layers are filled, an oxide etch may be performed at an appropriate time to create vias to reach drain polysilicon layer 104 of each active layer. The resulting structure is shown in FIG. 2(*vi*). In FIG. 2(*vi*) and in each figure discussed below, only for exemplary purposes, four active layers 101-1, 101-2, 101-3 and 101-4 are shown. In FIG. 2(*vi*), vias 203-1, 203-2, 203-3 and 203-4 are vias illustrative of the vias that can be created to access the semiconductor and conductor material layers of the active layers present. One of ordinary skill in the art would understand that the present invention is applicable to any structure with any number of active layers and vias desired. When filled with a conductor material (e.g., tungsten or p$^+$ polysilicon), these vias provide electrical connectivity between drain polysilicon 104 and circuitry in semiconductor substrate 150 through the conductors in one or more global interconnect layers to be formed above memory structure 100.

Figure 3:
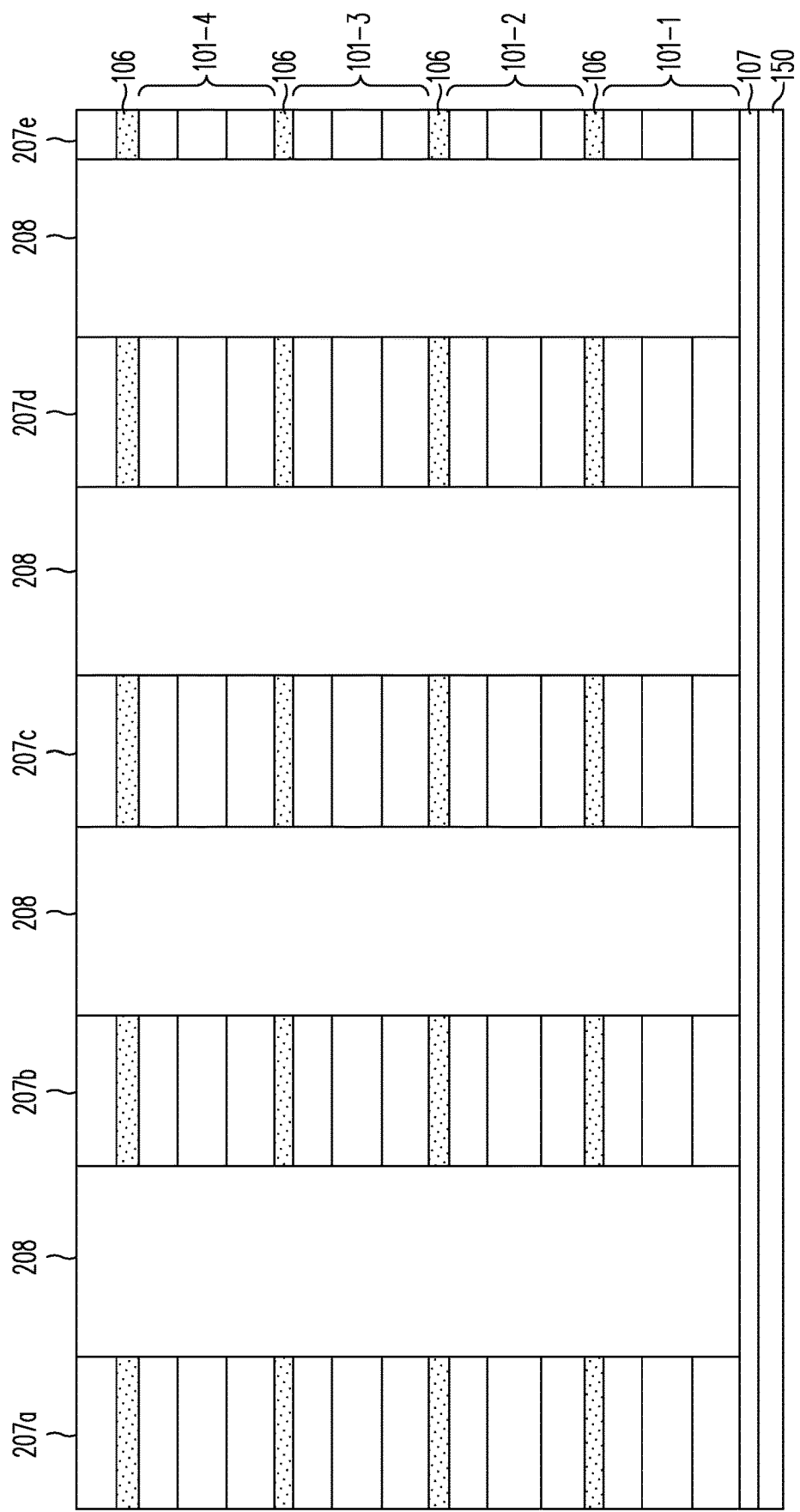
FIG. 3(ii) shows resulting memory structure 100, with active stacks 207a-207e, after the trenches are filled using the silicon oxide, photoresist 206 is removed, and the resulting surface planarized by CMP.
Figure 3V:
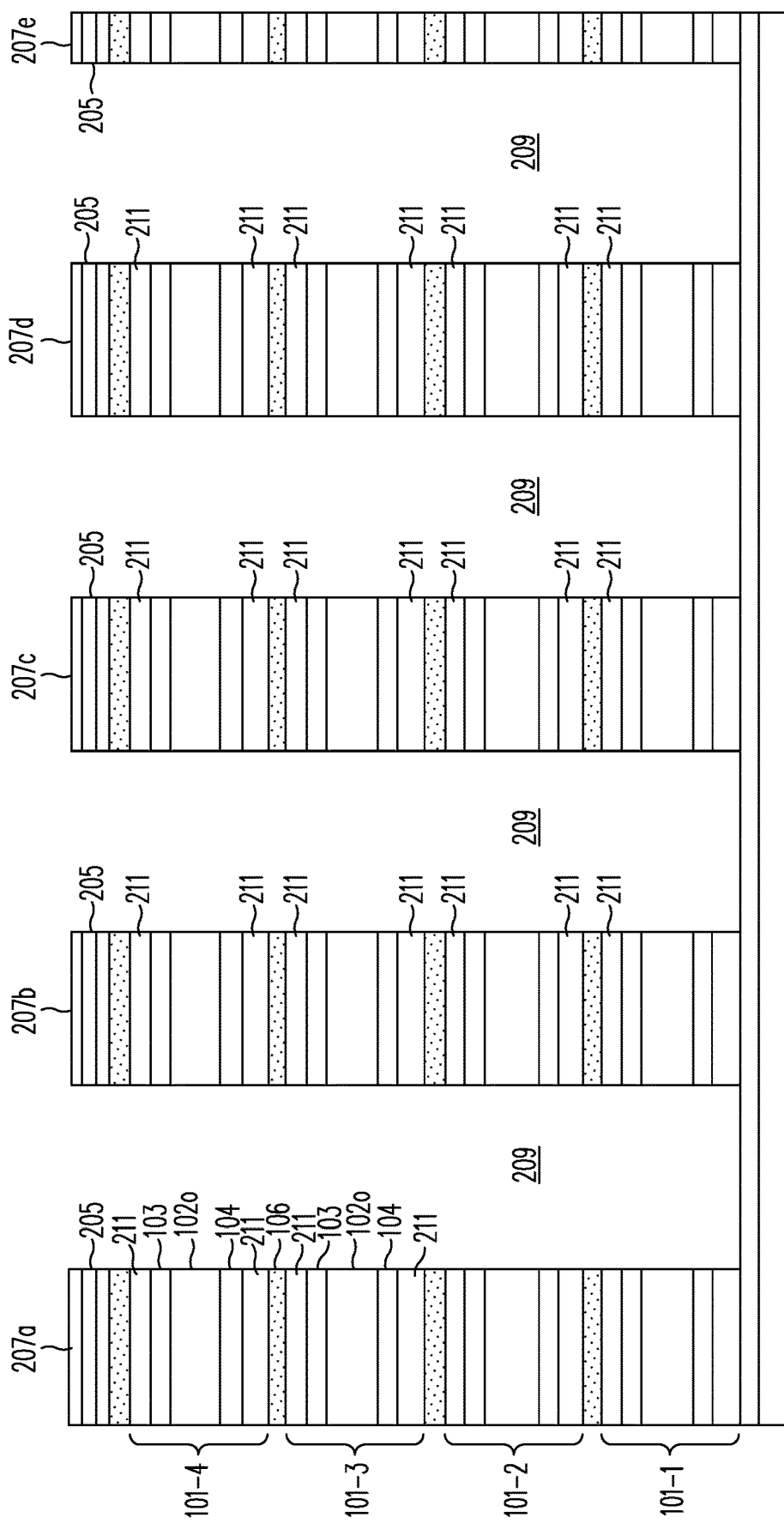
FIG. 3(v) shows resulting memory structure 100 after removal of SAC4 layers 105s-b and 105s-t from the active stacks, thereby creating cavities 211 in their place.
Figure 3:
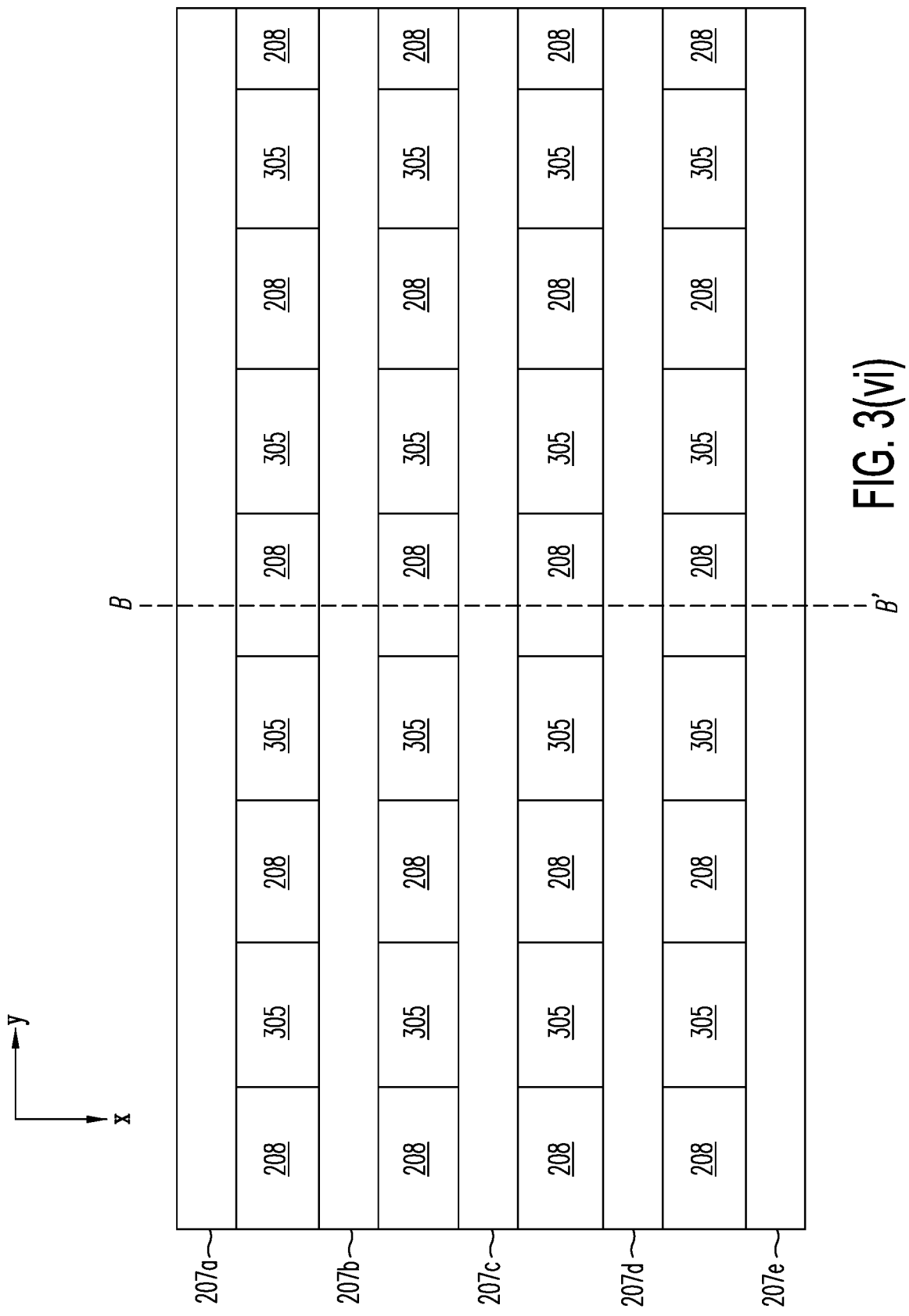
Figure 3:
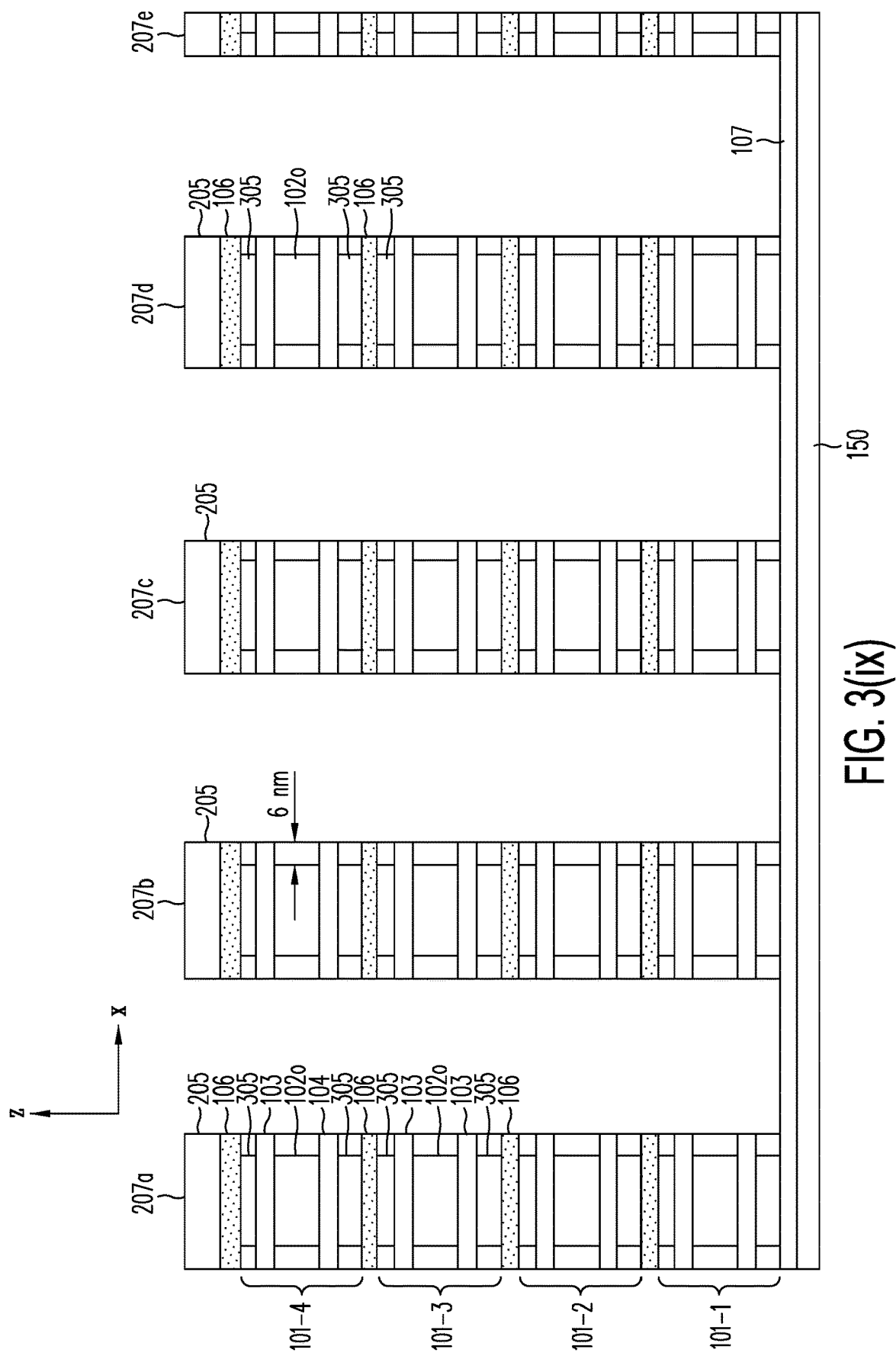
Figure 3X:
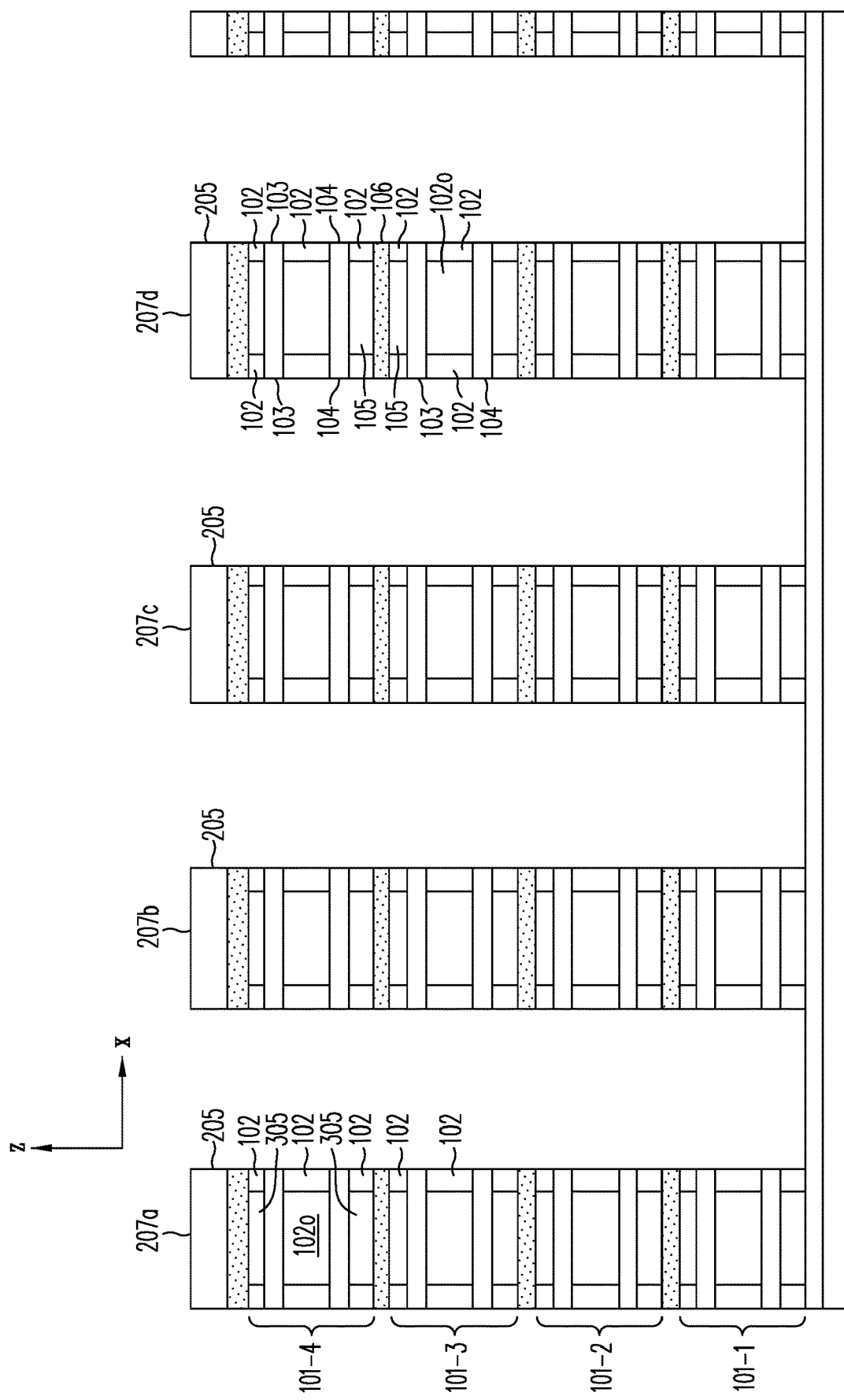
FIG. 3(x) shows an x-z plane cross sectional view through the word line trenches, showing channel polysilicon 102 filling the recesses in metallic/conductor layer 105 and spline oxide 102o.
Figure 3:
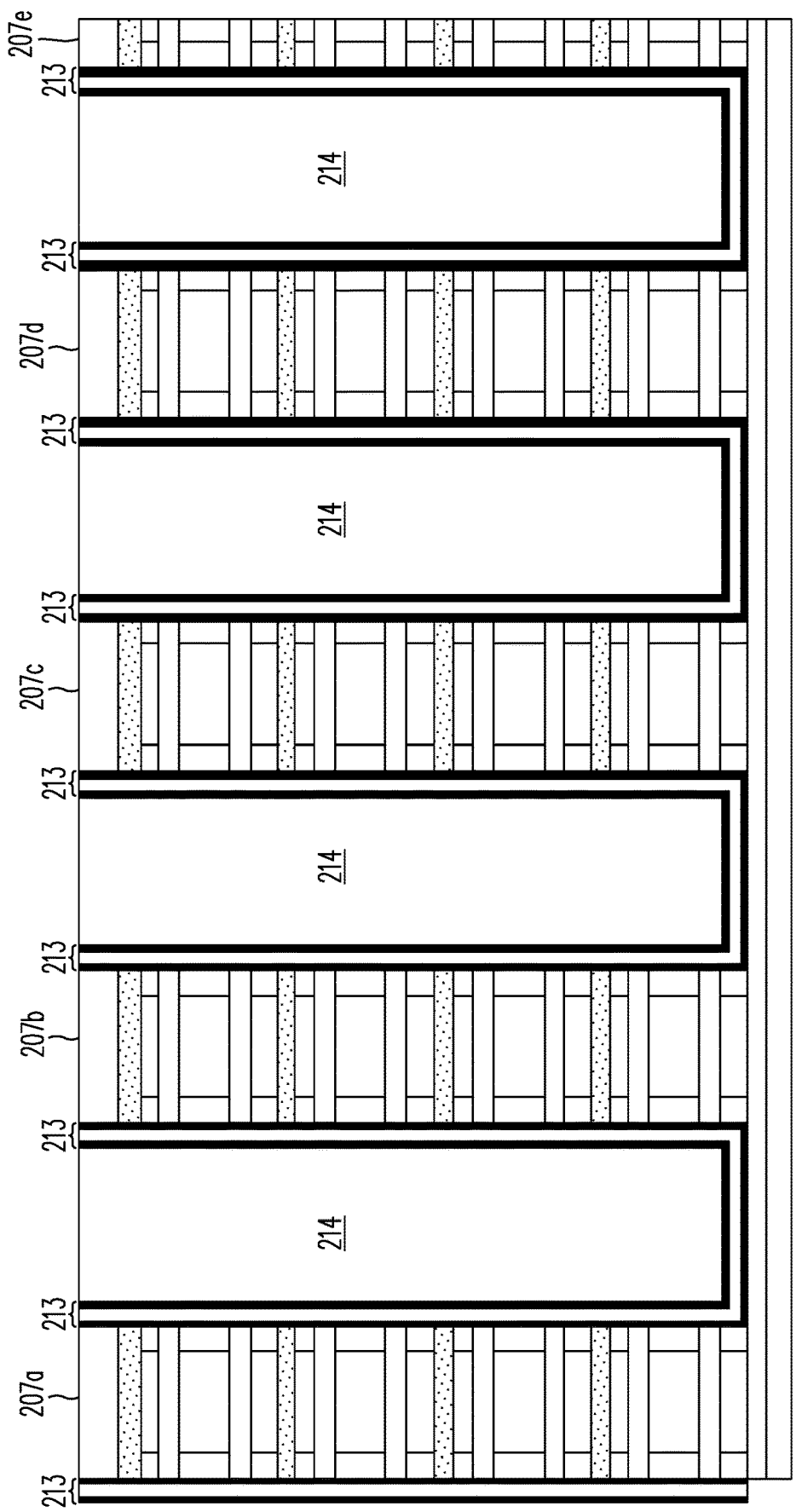

After all the active layers are deposited, hard mask layer 205 is provided over the active layers in array portion 109. Photoresist layer 206 is the provided and patterned to define the active stacks and trenches therebetween. FIG. 3(*i*) is an x-z plane cross-sectional view of array portion 109 of memory structure 100, showing patterned photoresist layer 206 defining a 45-nm width for each active stack and a 65-nm width for each trench between adjacent active stacks. An etch through hard mask layer 205 and the active layers not protected by photoresist layer 206 creates the active stacks and trenches therebetween. Silicon oxide 208 is then deposited to fill the trenches. FIG. 3(*ii*) shows resulting memory structure 100, with active stacks 207*a* to 207*e*, after filling the trenches using silicon oxide, removal of photoresist 206 and planarization by CMP. Unless specified, all x-z plane cross-sectional views in FIGS. 3(*i*)-3(*xii*) are made in array portion 109 of memory structure 100.

Silicon oxide 208 is then patterned and etched to define trenches to be subsequently filled by conductors ("word line trenches"). The remaining silicon oxide 208 ("silicon oxide columns") provide electrical insulation between adjacent word line conductors. FIGS. 3(*iii*) and 3(*iv*) are top and x-z plane cross-sectional views, respectively, showing resulting memory structure 100 after etching word line trenches 209. In FIGS. 3(*iii*) and 3(*iv*) the word line trenches and remaining oxide column as both 65 nm wide. The cross-section of FIG. 3(*iv*) is taken along dashed line A-A' shown in FIG. 3(*iii*).

Sacrificial SAC4 layers 105*s-t* and 105*s-b* in each active layer, which are adjacent source polysilicon 103 and drain polysilicon 104, respectively, are next removed by a selective isotropic etching technique. The isotropic etching proceeds laterally from word line trenches 209 until all the sacrificial materials in SAC4 layers 105*s-t* and 105*s-b* are removed. During this process, the silicon oxide columns provide mechanical support to the active stacks (e.g., active stacks 207*a*-207*e* of FIG. 3(*iv*)). FIG. 3(*v*) shows resulting memory structure 100 after all SAC4 layers 105*s-b* and 105*s-t* are removed from the active stacks, thereby creating cavities 211 in their place.

Cavities 211 and word line trenches 209 are then filled using a metallic/conductor material. The metallic/conductor material may be provided by, for example, successive depositions of a barrier material (e.g., tungsten nitride or titanium nitride) and tungsten. FIGS. 3(*vi*) and 3(*vii*) are top and x-z plane cross-sectional views, respectively, showing resulting memory structure 100 after word line trenches 209 and cavities 211 are filled using a metallic/conductor material. In FIG. 3(*vii*), cavities 211 in the active strips are replaced by metallic/conductor layers 305. The x-z plane cross-sectional view of FIG. 3(*vii*) is taken along dashed line B-B' shown in FIG. 3(*vi*).

Thereafter, an anisotropic etch removes the metallic/conductor material 305 from the word line trenches. In one embodiment, silicon oxide columns 208 continues to provide mechanical support after replacement of the SAC4 layers by metallic/conductor layers 305. Alternatively, the silicon oxide columns can be removed by an anisotropic oxide at this time.

A selective isotropic etches to recess metallic/conductor layers 105 and spline oxide 102*o* can then be made. In one embodiment, the selective isotropic etch recesses each metallic/conductor layer 305 from the sidewalls of the active stacks by 5-6 nm. The isotropic oxide etch recesses spline oxide 102*o* by, for example, 5-6 nm from the sidewalls of the active stacks. If silicon oxide columns 208 are not removed, the isotropic oxide etch also recess the exposed side walls of silicon oxide columns 208 along the y direction by the same amount on each side. FIGS. 3(*viii*) and 3(*ix*) are top and x-z plane cross-sectional views, respectively, showing resulting memory structure 100 after both metallic/conductor layers 305 and spline oxide 102*o* are recessed. FIG. 3(*viii*) refers to the embodiment in which silicon oxide columns 208 are retained.

A lightly-doped p⁻ polysilicon ("channel polysilicon 102") may then be deposited to fill both the recesses in metallic/conductor layer 305 and spline oxide 102*o*, and the word line trenches. An anisotropic etch of channel polysilicon 102 may be followed to remove channel polysilicon 102 from word line trenches 209. Channel polysilicon 102 may be provided by deposition of in situ boron-doped polysilicon with a dopant concentration, for example, at $5.0 \times 10^{18}$ cm$^{-3}$.

FIG. 3(*x*) is a x-z plane cross-sectional view through word line trenches 209, showing channel polysilicon 102 filling the recesses in metallic/conductor layer 305 and spline oxide 102*o*. One disadvantage from not removing silicon oxide columns 208 prior to the isotropic oxide etch is that the portions of spline oxide 102*o* behind silicon oxide column 208 are protected and not recessed. As a result, channel polysilicon 102 deposited on an active strip is not continuous along the y direction, and each memory cell on the active strip has its very small separate, discrete region of channel polysilicon, which may not be efficient in providing sufficient charge carriers during storage transistor operations (e.g., an erase operation).

Figure 4:
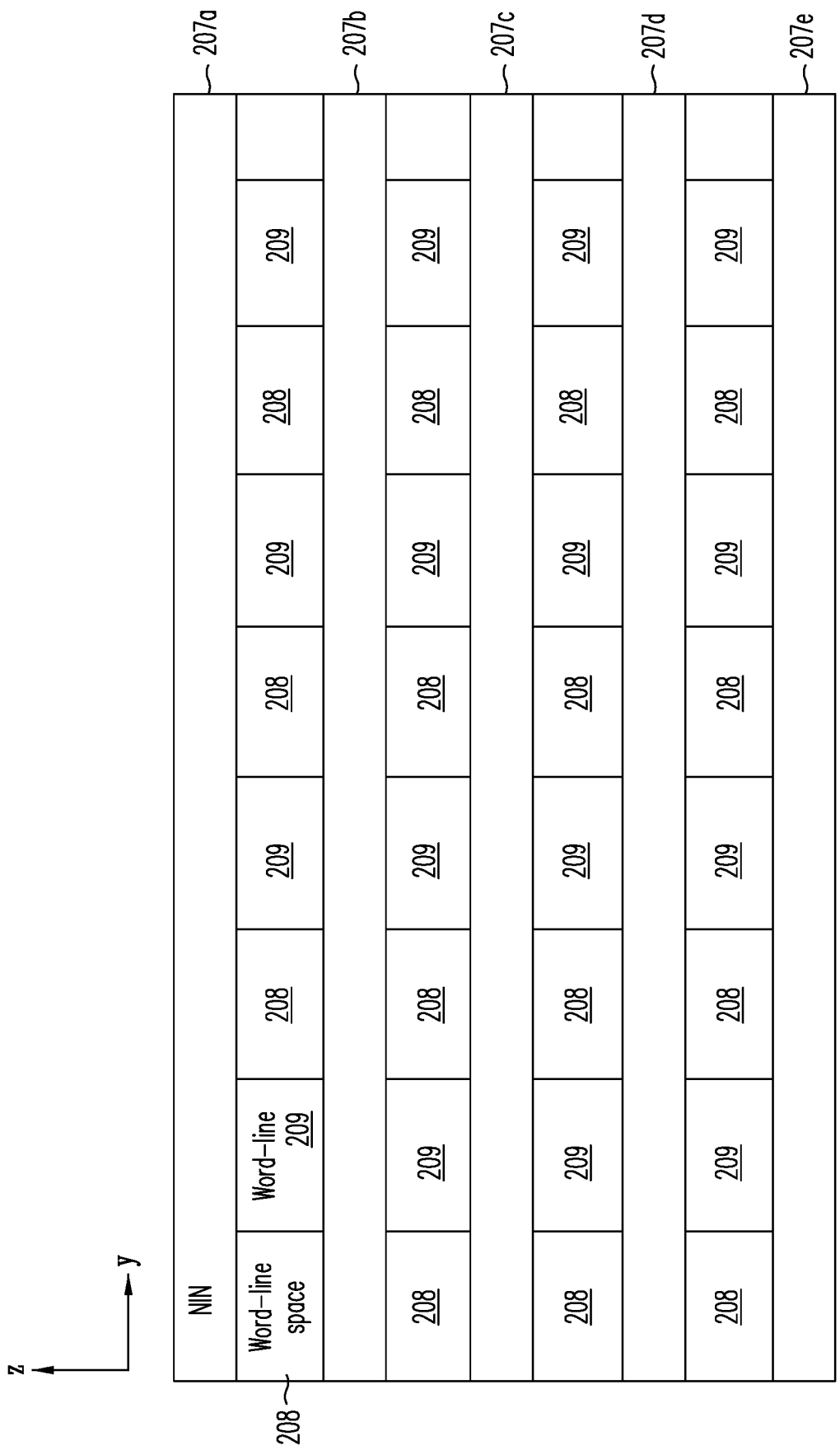
FIG. 4 shows a top view of memory structure 100 after the word line spacer columns are patterned and etched.

If silicon oxide columns 208 are removed after the replacement of SAC4 layers 105*s-t* and 105*s-t* by metallic/conductor layers 305, as discussed above, word line spacer columns may be provided at this time by filling the trenches (resulting from removing silicon oxide columns 208) between adjacent active stacks using a silicon oxide, patterning and etching the silicon oxide. The resulting word line spacer columns are similar and are referred to, going forward, silicon oxide columns 208, had they been retained. FIG. 4 shows a top view of memory structure 100 after the word line spacer columns are patterned and formed. To simplify the following detailed description, these word line spacer columns may be treated the same as silicon oxide columns 208 in the remainder of the processing. Accordingly, these word line spacer columns are also labeled 208 and no further distinction is made between these two sets of columns in the remainder of this detailed description.

Charge storage material 213 may then be deposited, which lines conformally the side walls of word line trenches 209. Charge storage material 213 may be achieved by successive depositions (in order) of: a 2-nm thick tunnel oxide, a 6-nm thick silicon-rich nitride, a 6-nm thick silicon oxide and 2-nm thick aluminum oxide ($Al_2O_3$). Thereafter, charge storage material-lined word line trenches 209 can then be filled by conductor material 214 (e.g., p⁺ polysilicon) to provide the word lines. Planarization by CMP can then remove the excess charge storage material 213 and conductor material 214 from the top surface of memory structure 100. FIG. 3(*xi*) is a x-z plane cross-sectional view of memory structure 100 after charge storage material 213 and word lines 214 have been deposited and planarized.

Buffer oxide 215 may be deposited over memory structure 100, patterned and etched to provide contact vias to word lines 214 under buffer oxide 215. These contact vias may be filled by tungsten ("tungsten plugs"). Tungsten plugs may also be provided at the same time in the vias made in staircase portions 108 to contact drain polysilicon or bit lines 104. Global interconnect lines may be provided above memory structure 100 subsequently to interconnect word lines 214 and bit lines 104 to circuitry in semiconductor substrate 150. FIG. 3(*xii*) shows a top view of a portion of array portion 108 of memory structure 100. As shown in FIG. 3(*xii*), connections by global interconnect lines 216 to word lines 214 are staggered (i.e., each of global interconnect lines 216 connects every other one of word lines 214; another global interconnect lines connects the remaining word lines along the first global interconnect line).

The above detailed description is provided to illustrate specific embodiments of the present invention and is not intended to be limiting. Numerous variations and modifications within the scope of the present invention are possible. The present invention is set forth in the accompanying claims.

We claim:

1. A process, comprising:
providing one or more active layers over a planar surface of a semiconductor substrate, each active layer comprising (i) first and second semiconductor layers of a first conductivity type; (ii) a dielectric layer separating the first and second semiconductor layers; and (ii) one or more sacrificial layers, at least one of the sacrificial layers being adjacent the first semiconductor layer;
etching the active layers to create a plurality of active stacks and a first set of trenches each separating and exposing sidewalls of adjacent active stacks;
filling the first set of trenches by a silicon oxide;
patterning and etching the silicon oxide to create silicon oxide columns each abutting adjacent active stacks and to expose portions of one or more sidewalls of the active stacks;
removing the sacrificial layers from the exposed portions of the sidewalls by isotropic etching through the exposed portions of the sidewalls of the active stacks to create cavities in the active layers;
filling the cavities in the active stacks by a metallic or conductor material;
recessing the dielectric layer from the exposed sidewalls of the active stacks; and
filling recesses in the dielectric layer by a third semiconductor layer of a second conductivity opposite the first conductivity.

2. The process of claim 1, wherein adjacent active layers are separated by an isolation layer.

3. The process of claim 1, further comprising recessing the metallic or conductor layer from the exposed sidewalls of the active stacks, wherein filling recesses in the dielectric layer also fills recesses in the metallic or conductor material.

4. The process of claim 1, further comprising:
removing the silicon oxide columns prior to recessing the dielectric layer and
re-creating the silicon oxide columns after filling the recesses in the dielectric layer by the third semiconductor layer.

5. The process of claim 1, further comprising providing a charge storsge material over the exposed sidewalls of the active stack.

6. The process of claim 1, further comprising forming word lines by filling spaces surrounded by adjacent silicon oxide columns and the active stacks with a conductor material.

7. The process of claim 6, wherein the third semiconductor layer comprises an in situ boron-doped polysilicon.

8. The process of claim 7, wherein (i) the first and second semiconductor layers of each active layer respectively form a common drain region and a common drain region of a plurality of storage transistors organized as a NOR memory string; (ii) the third semiconductor layer forms channel regions of the storage transistors in the NOR memory string; and (iii) the word lines form gate electrodes of the storage transistors in the NOR memory string.

9. A process, comprising:
(i) providing a first active layer;
(ii) providing a first isolation layer on top of the first active layer;
(iii) providing a second active layer on top of the first isolation layer, wherein the first and second active layers each comprise (a) a first semiconductor layer of a first conductivity type ; (b) a dielectric layer of an insulative material underneath the first semiconductor layer; and (c) a second semiconductor layer underneath the dielectric layer;
(iv) providing a second isolation layer on top of the second active layer;
(iv) providing and patterning a photoresist layer over the second isolation layer to create an opening in the photoresist layer, thereby exposing a first area of the second isolation layer;
(v) anisotropically removing the exposed first area of the second isolation layer and the portion of the second active layer under the first area of the second isolation layer so as to expose a first area of the first isolation layer;
(vi) recessing the photoresist layer to increase the opening in the photoresist layer, such that a second area of the second isolation layer is exposed;
(vii) anisotropically removing (a) the exposed first area of the first isolation layer and the exposed second area of the second isolation area, and (ii) the portions of the first semiconductor layer underneath the exposed first area of the first isolation layer and the exposed second area of the second isolation area;
(viii) filling cavities created by the anisotropically removing steps of (v) and (vii), using the insulative material;
(ix) repeating steps (i) through (viii) a predetermined number of times; and
(x) anisotropically removing the insulative material at predetermined locations to create via openings to reach the first semiconductor layer of two or more active layers.

* * * * *